(12) United States Patent
Butz et al.

(10) Patent No.: US 7,597,962 B2
(45) Date of Patent: Oct. 6, 2009

(54) COATED ARTICLE WITH IR REFLECTING LAYER AND METHOD OF MAKING SAME

(75) Inventors: Jochen Butz, Wolfen (DE); Richard Blacker, Farmington Hills, MI (US); Uwe Kriltz, Jena (DE); Anton Dietrich, Fontnas (CH)

(73) Assignees: Centre Luxembourgeois de Recherches pour le Verre et la Ceramique S.A. (C.R.V.C.), Grand Duche de Luxembourg (LU); Guardian Industries Corp., Auburn Hills, MI (US)

( * ) Notice: Subject to any disclaimer, the term of this patent is extended or adjusted under 35 U.S.C. 154(b) by 244 days.

(21) Appl. No.: 11/146,274

(22) Filed: Jun. 7, 2005

(65) Prior Publication Data

US 2006/0275613 A1    Dec. 7, 2006

(51) Int. Cl.
*B32B 17/06*    (2006.01)

(52) U.S. Cl. .................. 428/432; 428/698; 428/469; 428/701; 428/702

(58) Field of Classification Search ................ 428/428, 428/432, 698, 697, 699, 701, 702, 704
See application file for complete search history.

(56) References Cited

U.S. PATENT DOCUMENTS

| | | | |
|---|---|---|---|
| 5,344,718 A | 9/1994 | Hartig et al. | |
| 5,514,476 A | 5/1996 | Hartig et al. | |
| 5,552,180 A | 9/1996 | Finley et al. | |
| 5,770,321 A | 6/1998 | Hartig et al. | |
| 5,800,933 A | 9/1998 | Hartig et al. | |
| 5,821,001 A * | 10/1998 | Arbab et al. | 428/623 |
| 5,834,103 A | 11/1998 | Bond et al. | |
| 5,948,538 A | 9/1999 | Brochot et al. | |
| 5,962,115 A | 10/1999 | Zmelty et al. | |
| 6,045,896 A | 4/2000 | Boire et al. | |
| 6,287,675 B1 | 9/2001 | Guiselin et al. | |
| 6,398,925 B1 | 6/2002 | Arbab et al. | |
| 6,524,714 B1 | 2/2003 | Neuman et al. | |
| 6,541,084 B2 | 4/2003 | Wang | |
| 6,562,490 B2 | 5/2003 | Ebisawa et al. | |
| 6,572,940 B1 | 6/2003 | Noethe et al. | |
| 6,576,349 B2 | 6/2003 | Lingle et al. | |
| 6,582,809 B2 | 6/2003 | Boire et al. | |
| 6,589,658 B1 | 7/2003 | Stachowiak | |

(Continued)

FOREIGN PATENT DOCUMENTS

EP    1 089 947    10/2003

(Continued)

OTHER PUBLICATIONS

U.S. Appl. No. 11/029,025, filed Jan. 5, 2005.

(Continued)

*Primary Examiner*—Ling Xu
(74) *Attorney, Agent, or Firm*—Nixon & Vanderhye P.C.

(57) ABSTRACT

A coated article is provided with at least one infrared (IR) reflecting layer (e.g,. silver based). In certain example embodiments, silicon nitride, zinc oxide, and an oxide of Ni and/or Cr are provided under the IR reflecting layer. It has been found that improved thermal stability may be realized upon heat treatment. In certain example instances, the silicon nitride may be replaced with tin oxide.

22 Claims, 3 Drawing Sheets

U.S. PATENT DOCUMENTS

| | | |
|---|---|---|
| 6,596,135 B1 | 7/2003 | Mitsui |
| 6,602,587 B2 | 8/2003 | Macquart et al. |
| 6,632,491 B1 | 10/2003 | Thomsen et al. |
| 6,667,121 B2 | 12/2003 | Wang |
| 6,673,427 B2 | 1/2004 | Guiselin et al. |
| 6,686,050 B2 | 2/2004 | Lingle et al. |
| 6,692,831 B2 | 2/2004 | Stachowiak |
| 6,723,211 B2 | 4/2004 | Lingle et al. |
| 6,743,343 B2 | 6/2004 | Kida et al. |
| 6,749,941 B2 | 6/2004 | Lingle |
| 6,782,718 B2 | 8/2004 | Lingle et al. |
| 6,787,005 B2 | 9/2004 | Laird et al. |
| 6,800,182 B2 | 10/2004 | Mitsui et al. |
| 6,802,943 B2 | 10/2004 | Stachowiak |
| 2003/0150711 A1 | 8/2003 | Laird |
| 2003/0194488 A1* | 10/2003 | Stachowiak ................ 427/162 |
| 2003/0194567 A1 | 10/2003 | Lingle et al. |
| 2003/0198816 A1 | 10/2003 | Lingle et al. |
| 2004/0005467 A1 | 1/2004 | Neuman et al. |
| 2004/0121165 A1 | 6/2004 | Laird |
| 2004/0180214 A1 | 9/2004 | Laird et al. |
| 2005/0025917 A1 | 2/2005 | Laird et al. |
| 2005/0042459 A1 | 2/2005 | Kriltz et al. |
| 2005/0042460 A1 | 2/2005 | Kriltz |
| 2006/0159932 A1* | 7/2006 | Lu et al. ..................... 428/432 |

FOREIGN PATENT DOCUMENTS

| | | |
|---|---|---|
| JP | 62-041740 | 2/1987 |
| WO | WO 00/37384 | 6/2000 |
| WO | WO 03/055818 | 7/2003 |

OTHER PUBLICATIONS

U.S. Appl. No. 11/037,452, filed Jan. 19, 2005.
U.S. Appl. No. 60/625,164, filed Nov. 5, 2004.
"Method and Multichamber Apparatus to Coat a Glass Substrate With a Multilayer SnO/ZnO/Ag/CrNOx" Valentino et al., EP1371745, Dec. 17, 2003.
US 4,960,645, 10/1990, Lingle et al. (withdrawn)

* cited by examiner

COATED ARTICLE WITH IR REFLECTING LAYER AND METHOD OF MAKING SAME

This application relates to a coated article including at least one infrared (IR) reflecting layer of a material such as silver or the like. In certain example non-limiting embodiments, the provision of a layer comprising silicon nitride in a particular area have been found to improve the thermal stability of the coated article (e.g., upon tempering or the like). Moreover, in certain example non-limiting embodiments, a layer comprising zinc oxide is provided under the IR reflecting layer in order to improve qualities thereof, and a layer comprising a material such as an oxide of Ni and/or Cr is provided between the IR reflecting layer and the zinc oxide inclusive layer in order to improve thermal stability upon heat treatment (e.g., thermal tempering) and to substantially preserve performance following such heat treatment. In certain example non-limiting embodiments, the zinc oxide inclusive layer is formed by sputtering a ceramic target, which has been found to improve properties of the IR reflecting layer. In view of the above, it is possible to permit the coated article for example to realize improved properties such as one or more of thermal stability upon heat treatment, emittance, U-value, and/or specific resistivity. Coated articles herein may be used in the context of insulating glass (IG) window units, or in other suitable applications such as monolithic window applications, laminated windows, and/or the like.

BACKGROUND AND SUMMARY OF EXAMPLE EMBODIMENTS OF THE INVENTION

Coated articles are known in the art for use in window applications such as insulating glass (IG) window units, vehicle windows, monolithic windows, and/or the like. In certain example instances, designers of coated articles often strive for a combination of high visible transmission, substantially neutral color, low emissivity (or emittance), low sheet resistance ($R_s$) low U-values in the context of IG window units, and/or low specific resistivity. High visible transmission and substantially neutral color may permit coated articles to be used in applications where these characteristics are desired such as in architectural or vehicle window applications, whereas low-emissivity (low-E), low sheet resistance, and low specific resistivity characteristics permit such coated articles to block significant amounts of IR radiation so as to reduce for example undesirable heating of vehicle or building interiors.

Consider a typical coated article with the following layer stack. This coated article is suitable for use in an IG (insulation glass) window unit. For the coated article listed below, the coating includes layers that are listed from the glass substrate outwardly.

| Layer | Thickness (Å) |
|---|---|
| Glass | |
| $TiO_x$ | 140 Å |
| $SnO_x$ | 100 Å |
| $ZnAlO_x$ | 70 Å |
| Ag | 118 Å |
| $NiCrO_x$ | 20 Å |
| $SnO_x$ | 223 Å |
| $SiN_x$ | 160 Å |

The silver (Ag) layer of the above coated article has a thickness of 118 angstroms (Å) and a sheet resistance ($R_s$) of 4.6 ohms/square. This translates into a specific resistivity ($R_s$ multiplied by thickness of the IR reflecting layer) for the silver IR reflecting layer of 5.43 micro-ohms·cm.

While the aforesaid specific resistivity (SR) of the silver IR reflecting layer is adequate in many situations, it would be desirable to improve upon the same. For example, if the above coated article is heat treated (e.g., thermally tempered), it does not have good thermal stability. In other words, such heat treatment (HT) causes optical properties of the coated article (e.g., one or more of a*, b*, L*, haze) to substantially change in an undesirable manner. If the a*, b* and/or L* values change too much upon HT of the coated article, then the coated article is said to be thermally unstable since it looks much different after HT than before HT. Moreover, if emissivity and/or sheet resistance ($R_s$) goes up too much upon HT, then the product is also said to be thermally unstable.

U.S. Patent Document 2005/0042460 (the disclosure of which is hereby incorporated herein by reference) discloses a layer stack that is suitable in many different instances, where the zinc oxide layer contacts the underside of the silver IR reflecting layer. It has been found that when the zinc oxide directly contacts the bottom side of the silver, in certain instances the haze and/or sheet resistance of the coating rise too much upon HT.

In view of the above, it will be appreciated that there exists a need in the art for a coated article including a coating which has good thermal properties (e.g., emissivity/emittance and sheet resistance), good optical properties (e.g., a*, b* and/or L*), and which has such good thermal and optical properties following heat treatment such as thermal tempering. Certain example embodiments of this invention relate to a coated article which permits one or more of these advantages to be realized.

In certain example embodiments of this invention, it has surprisingly been found that the provision of a layer stack including the following sequence of layers, moving away from the glass substrate, is advantageous: (a) a layer of or including silicon nitride, (b) a layer of or including zinc oxide, (c) a layer of or including an oxide of Ni and/or Cr, and (d) an IR reflecting layer. This sequence of layers permits the coated article to realized improved thermal stability. Thus, the coated article's color, haze, emittance and sheet resistance do not change in an undesirable manner due to heat treatment (HT). For example the emittance and/or sheet resistance does not rise substantially (but may decrease) upon HT, and/or the coated article does not becomes too hazy due to HT. In certain example embodiments layers of or including titanium oxide (and possibly tin oxide) may be provided under and contacting the layer comprising silicon nitride.

In other example embodiments of this invention, it has surprisingly been found that the following sequence of layers is advantageous: (a) a layer of or including tin oxide, (b) a layer of or including zinc oxide, (c) a layer of or including an oxide of Ni and/or Cr, and (d) an IR reflecting layer (e.g., silver inclusive layer). This sequence of layers permits the coated article to realized improved thermal stability. Thus, the coated article's color and haze do not change in an undesirable manner due to HT. For example, the a*, b* and/or L* values do not change too much upon HT, and/or the coated article does not becomes too hazy due to HT.

In certain example embodiments of this invention, the zinc oxide inclusive layer may be formed by sputtering a ceramic target. It has been found that implementing a zinc oxide inclusive layer formed using a ceramic target, beneath a layer comprising an oxide of Ni and/or Cr, yields an improvement in the quality of the overlying silver inclusive IR reflecting layer. This structure has also been surprisingly found to provide a greater degree of thermal stability during HT compared to the use of zinc oxide alone as the seed layer under the silver.

In certain example embodiments of this invention, it is especially surprising that such advantages can be realized in a single IR reflecting layer coating (e.g., single silver coating) that is also able to realize, when used in an IG (insulating glass) unit, a U-value of no greater than 1.25 W/(m² K), more preferably no greater than 1.20 W/(m²K), even more preferably no greater than 1.15 W/(m²K), and most preferably no greater than 1.10 W/(m²K).

In certain example embodiments of this invention, there is provided a heat treated coated article including a coating supported by a glass substrate, the coating comprising: a dielectric layer; a layer comprising silicon nitride; a layer comprising zinc oxide over and directly contacting the layer comprising silicon nitride; a layer comprising an oxide of Ni and/or Cr over and directly contacting the layer comprising zinc oxide; an infrared (IR) reflecting layer comprising silver on the glass substrate, located over and directly contacting the layer comprising an oxide of Ni and/or Cr; another layer comprising an oxide of Ni and/or Cr located over and directly contacting the IR reflecting layer comprising silver; a layer comprising a metal oxide located over and directly contacting the another layer comprising the oxide of Ni and/or Cr; and a layer comprising silicon nitride located over the layer comprising the metal oxide.

In other example embodiments of this invention, there is provided a coated article including a coating supported by a glass substrate, the coating comprising, from the glass substrate outwardly: a layer comprising silicon nitride or tin oxide; a layer comprising zinc oxide over and directly contacting the layer comprising silicon nitride or tin oxide; a layer comprising an oxide of Ni and/or Cr over and directly contacting the layer comprising zinc oxide; an infrared (IR) reflecting layer comprising silver over and directly contacting the layer comprising an oxide of Ni and/or Cr; and a dielectric layer.

In other example embodiments of this invention, there is provided a method of making a coated article, the method comprising: providing a glass substrate; forming a layer comprising silicon nitride or tin oxide on the glass substrate; sputtering a ceramic target comprising zinc and oxygen in an atmosphere including at least an inert gas in order to form a layer comprising zinc oxide on the glass substrate over and directly contacting the layer comprising silicon nitride or tin oxide; forming a layer comprising an oxide of Ni and/or Cr on the glass substrate over and directly contacting the layer comprising zinc oxide; forming an infrared (IR) reflecting layer comprising silver on the glass substrate over and directly contacting the layer comprising an oxide of Ni and/or Cr; and forming a dielectric layer over at least the IR reflecting layer.

DETAILED DESCRIPTION OF EXAMPLE EMBODIMENTS OF THE INVENTION

Referring now to the drawings in which like reference numerals indicate like parts throughout the several views.

Coated articles herein may be used in applications such as monolithic windows, IG window units, vehicle windows, and/or any other suitable application that includes single or multiple substrates such as glass substrates.

In certain example embodiments of this invention, there is provided a coating for a coated article, such that the coating has good thermal properties (e.g., emissivity/emittance and sheet resistance), good optical properties (e.g., a*, b* and/or L*), and has such good thermal and optical properties following heat treatment (HT) such as thermal tempering, heat bending, heat strengthening, or the like. Certain example embodiments of this invention relate to a coated article which permits one or more of these advantages to be realized.

In certain example embodiments of this invention, it has surprisingly been found that the provision of a layer stack including the following sequential layers, moving from the glass substrate outwardly: (a) layer comprising silicon nitride, (b) layer comprising zinc oxide over and contacting the layer comprising silicon nitride, (c) a layer comprising an oxide of Ni and/or Cr over and contacting the layer comprising zinc oxide, and (d) an IR reflecting layer, e.g., comprising or consisting essentially of silver, located over and contacting the layer comprising the oxide of Ni and/or Cr. This sequence of layers permits the coated article to realize improved thermal stability. Thus, the coated article's color, haze, emittance and sheet resistance do not change in an undesirable manner due to heat treatment (HT). For example the emittance and/or sheet resistance does not rise substantially (but may decrease) upon HT, and/or the coated article does not become too hazy due to HT. In certain example embodiments, a dielectric layer (e.g., of or including an oxide of titanium) may be provided under the above-listed sequence of layers so as to be between the sequence and the glass substrate. In certain other example embodiments, a layer of or including tin oxide may be provided between the layer comprising titanium oxide and the layer (a) of the sequence. In still further example embodiments, the layer (a) of the sequence may instead be of or comprise tin oxide.

In certain example embodiments of this invention, the sequence also surprisingly permits the IR reflecting layer (e.g., silver inclusive layer) to have a specific resistivity (SR) of no greater than 5.0, more preferably no greater than 4.8, and even more preferably no greater than 4.6 micro-ohms·cm, and possibly no greater than 4.2 following HT. Such low SR values permit U-values and emittance of the coating to be lowered given a particular thickness for the IR reflecting layer(s). Typically, for the same silver material, a lower emissivity requires more silver and thus less transmission. However, a lower specific resistivity allows a lower sheet resistance for the same transmission—which is typically a good thing since one may use less silver for the same performance.

Figure 1:
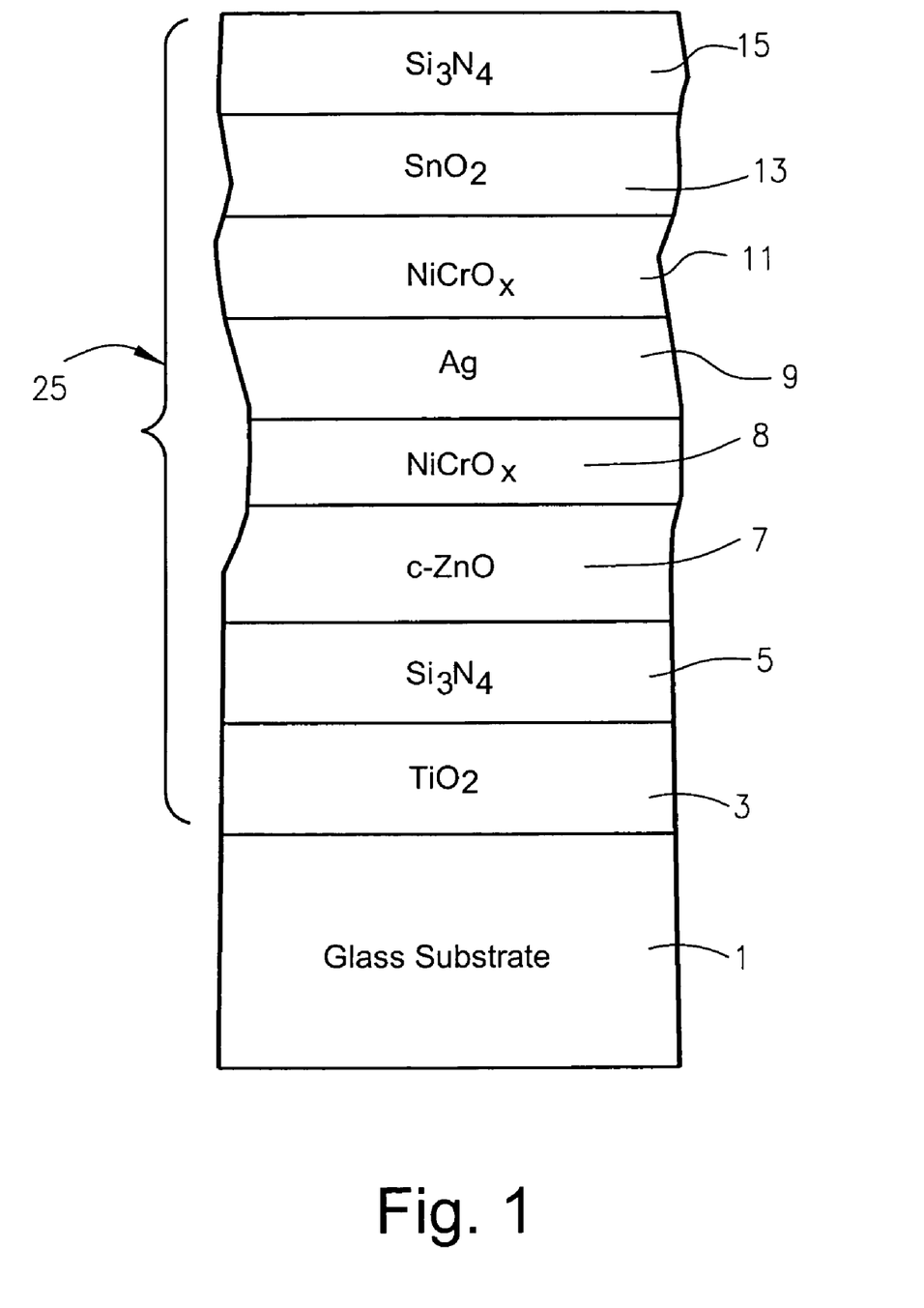
FIG. 1 is a cross sectional view of a coated article according to an example embodiment of this invention.

FIG. 1 is a cross sectional view of a coated article according to an example embodiment of this invention. The coated article includes glass substrate 1 (e.g., clear, green, bronze, or blue-green glass substrate from about 1.0 to 10.0 mm thick, more preferably from about 1.0 mm to 6.0 mm thick), and a multi-layer coating (or layer system) provided on the substrate either directly or indirectly. As shown in FIG. 1, the coating 25 comprises dielectric layer 3, dielectric layer 5 of or including silicon nitride (e.g., $Si_3N_4$, or some other suitable stoichiometry), zinc oxide inclusive layer 7 (e.g., $ZnO_x$ where "x" is from 1 to 3, more preferably about 2; or $ZnAlO_x$), bottom contact layer 8 of or including an oxide of Ni and/or Cr (e.g., $NiCrO_x$), IR (infrared) reflecting layer 9 including or of silver, gold, or the like, upper contact layer 11 of or including an oxide of Ni and/or Cr (e.g., $NiCrO_x$), metal oxide inclusive layer 13 (e.g., an oxide of tin), and dielectric layer 15 of or including a material such as silicon nitride and/or silicon oxynitride which may in certain example instances be a protective overcoat. Other layers and/or materials may also be provided in certain example embodiments of this invention, and it is also possible that certain layers may be removed or split in certain example instances. Moreover, one or more of the layers discussed above may be doped with other materials in certain example embodiments of this invention.

Figure 2:
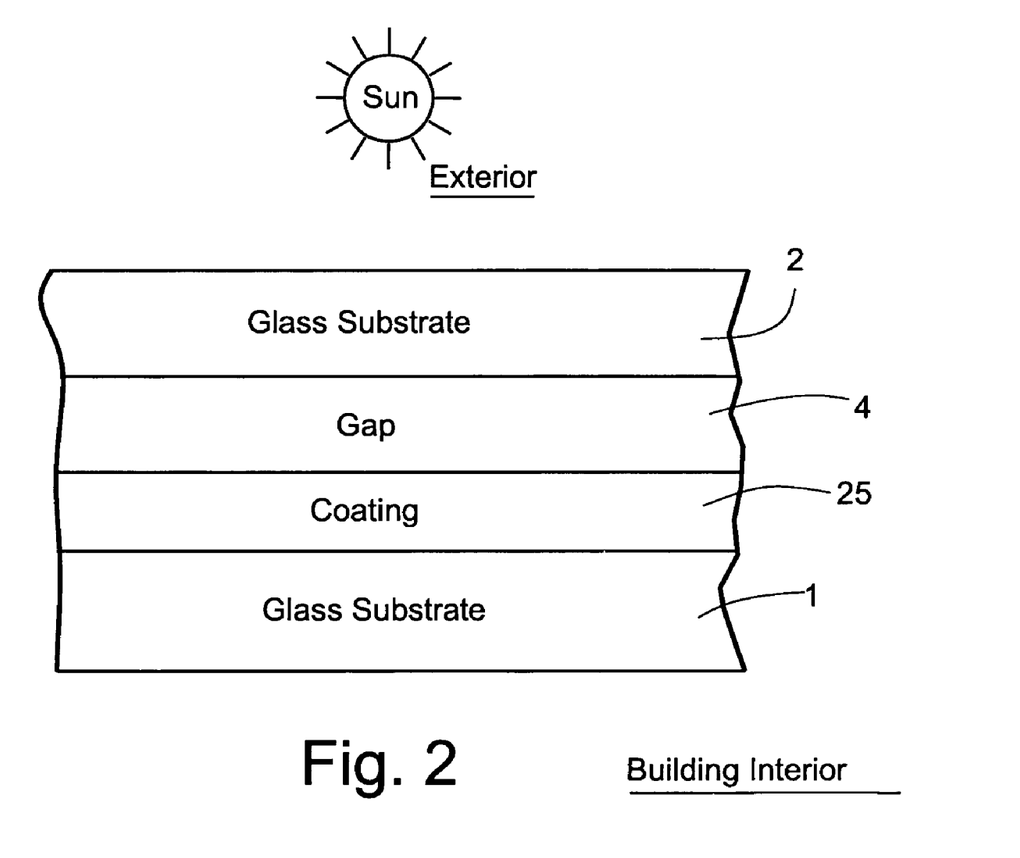
FIG. 2 is a cross sectional view of part of an insulating glass (IG) window unit including the coated article of FIG. 1 (or FIG. 3) according to an example embodiment of this invention.

In monolithic instances, the coated article includes only one substrate such as glass substrate 1 (see FIG. 1). However, monolithic coated articles herein may be used in devices such as IG window units for example. Typically, as shown in FIG. 2, an IG window unit may include two spaced apart substrates 1 and 2, with a gap 4 defined therebetween. Example IG window units are illustrated and described, for example, in U.S. Pat. Nos. 5,770,321, 5,800,933, 6,524,714, 6,541,084 and US 2003/0150711, the disclosures of which are all hereby incorporated herein by reference. An example IG window unit as shown in FIG. 2 may include, for example, the coated glass substrate 1 shown in FIG. 1 coupled to another glass substrate 2 via spacer(s), sealant(s) or the like with a gap 4 being defined therebetween. This gap 4 between the substrates in IG unit embodiments may in certain instances be filled with a gas such as argon (Ar). An example IG unit may comprise a pair of spaced apart substantially clear glass substrates each about 4 mm thick one of which is coated with a coating 25 herein in certain example instances, where the gap 4 between the substrates may be from about 5 to 30 mm, more preferably from about 10 to 20 mm, and most preferably about 16 mm. In certain example instances, the coating 25 may be provided on the side of the inner glass substrate 1 facing the gap (although the coating may be on the other substrate in certain alternative embodiments). Still referring to FIG. 2, in certain example IG unit embodiments of this invention, the coating 25 is designed such that the resulting IG unit (e.g., with, for reference purposes, a pair of 4 mm clear glass substrates spaced apart by 16 mm with Ar gas in the gap) has a U-value of no greater than 1.25 W/(m²K), more preferably no greater than 1.20 W/(m²K), even more preferably no greater than 1.15 W/(m²K), and most preferably no greater than 1.10 W/(m²K), even after the coated article has been subjected to optional HT such as tempering. U-value is measured in accordance with EN 673, the disclosure of which is hereby incorporated herein by reference.

The bottom dielectric layer 3 may be of or include titanium oxide in certain example embodiments of this invention. The titanium oxide of layer 3 may in certain example instances be represented by $TiO_x$, where x is from 1.5 to 2.5, most preferably about 2.0. The titanium oxide may be deposited via sputtering or the like in different embodiments. In certain example instances, dielectric layer 3 may have an index of refraction (n), at 550 nm, of at least 2.0, more preferably of at least 2.1, and possibly from about 2.3 to 2.6 when the layer is of or includes titanium oxide. In certain embodiments of this invention, the thickness of titanium oxide inclusive layer 3 is controlled so as to allow a* and/or b* color values (e.g., transmissive, film side reflective, and/or glass side reflective) to be fairly neutral (i.e., close to zero) and/or desirable. Other materials may be used in addition to or instead of titanium oxide in certain example instances. In certain alternative embodiments, the Ti in oxide layer 3 may be replaced with another metal.

Silicon nitride inclusive layer 5 is provided over at least dielectric layer 3. The layer 5 of or including silicon nitride is advantageous in that it permits thermal stability of the coating to be improved upon HT, since the silicon nitride acts as a so-called barrier against diffusion of certain materials during HT. Thus, color shifts can be reduced by using silicon nitride as or in layer 5.

Dielectric layer 7 is of or includes zinc oxide (e.g., ZnO). The zinc oxide of layer(s) 7 may contain other materials as well such as Al (e.g., to form $ZnAlO_x$) in certain example embodiments. For example, in certain example embodiments of this invention, zinc oxide layer 7 may be doped with from about 1 to 10% Al (or B), more preferably from about 1 to 5% Al (or B), and most preferably about 2 to 4% Al (or B). The use of zinc oxide 7 under the silver in layer 9 allows for an excellent quality of silver to be achieved. In certain example embodiments (e.g., to be discussed below) the zinc oxide inclusive sub-seed layer 7 may be formed via sputtering a ceramic ZnO inclusive rotatable magnetron sputtering target. It has been found that the use of the ceramic target (e.g., of ZnO, which may or may not be doped with Al, F or the like) allows for a high quality of silver to be provided thereby resulting in a lower emissivity coating.

In an effort to obtain a low emissivity (or emittance) low-E coating, one tries to ensure that the IR reflecting layer (e.g., silver layer 9) is as close to bulk properties as possible. This is often achieved by sputtering a "seed" layer on which it is possible to deposit and grow a perfected silver layer. An example typical seed layer is zinc oxide that is sputtered from a Zn metal target in an oxygen inclusive atmosphere. All of the oxygen for the seed layer thus comes from the oxygen gas in the sputtering chamber(s). However, sputtering the zinc oxide layer in a highly oxygenated atmosphere can lead to gaseous crosstalk contamination of an adjacent silver layer that is sputtered in an adjacent chamber(s), which can degrade the quality of the silver layer thereby leading to an increased emissivity and the coating as a whole.

In order to address this problem, it has been found in certain example embodiments of this invention that the zinc oxide inclusive layer 7 can be formed by sputtering a ceramic magnetron target (e.g., a target of ZnO, ZnAlO, or the like). The ratio of Zn:O in the ceramic target may be about 1:1 in certain example embodiments, but it may instead be substoichiometric in other example embodiments of this invention. It has been found that the use of such a ceramic target to form zinc oxide layer 7 allows for a higher quality of silver to be formed in IR reflecting layer 9 even though another layer separates layers 7 and 9—this is particularly surprising since the technique for forming a layer one layer removed from the IR reflecting layer affects the emissivity properties thereof. In other words, it has been found that implementing a zinc oxide inclusive layer 7 formed using a ceramic target, beneath a layer 8 comprising an oxide of Ni and/or Cr, yields an improvement in the quality of the silver inclusive IR reflecting layer 9. This structure has also been surprisingly found to provide a greater degree of thermal stability during HT compared to the use of zinc oxide alone as the seed layer under the silver. It is noted that the zinc oxide inclusive target(s) and the resulting layer may be doped with a non-metal such as F and/or B in certain example embodiments of this invention.

While the Zn:O in the ceramic target may be stoichiometric in certain example embodiments, at least one substoichiometric ceramic target comprising $ZnO_x$ (e.g., where $0.25 \leq x \leq 0.99$, more preferably $0.50 \leq x \leq 0.97$, and even more preferably 0.70≦x≦0.96) may instead be used in sputter-depositing a zinc oxide inclusive layer 7 under the contact layer 8. The term "substoichiometric" means that "x" is less than 1.0 in the case of $ZnO_x$ for example. In certain example embodiments of this invention, the substoichiometric nature of the $ZnO_x$ inclusive ceramic target for forming layer 7 causes the ceramic target to be more conductive, thereby reducing or eliminating the need for metal dopant(s) in the target 2. In particular, with no metal doping, a substoichiometric $ZnO_x$ inclusive ceramic target is able to realize improved sputtering yields and faster sputtering rates compared to a stoichiometric ZnO ceramic target. This is highly advantageous as will be appreciated by those of skill in the art. In certain example embodiments of this invention, no dopants are needed for substoichiometric $ZnO_x$ inclusive ceramic target(s) used in forming layer 7. However, in certain example embodiments of this invention, a substoichiometric $ZnO_x$ inclusive ceramic target is doped with a non-metal such as F and/or B (or alternatively a metal such as Al or the like). F and/or B when used as dopants increase the electrical conductivity of the target, which may be needed in certain situations where x is close to 1.0 even while the target is still slightly substoichiometric. In certain example embodiments of this invention, the ceramic target may be doped so as to include from about 0.5 to 5.0% F and/or B, more preferably from about 0.5 to 3% F and/or B (atomic %). In certain alternative embodiments of this invention, a stoichiometric ZnO ceramic target may be doped with from about 0.5 to 5.0% F and/or B, more preferably from about 0.5 to 3% F and/or B. In certain example embodiments, the target may be doped with from about 0.5 to 10.0% boron. The increase in conductivity caused by the doping of the target with F and/or B (or Al) may also lead to an increase in the IR reflection of the resulting coating in certain example embodiments of this invention. If not enough F and/or B is provided, the target may suffer with respect to conductivity in certain situations, and if too much F and/or B is provided in the target film growth and functionality would become undesirable since too much F and/or B would end up in the sputter-deposited film and the adjacent silver would have undesirable properties. It is noted that the amounts of fluorine and/or boron in the target sputtering material tend to also end up in the resulting zinc oxide inclusive layer on the substrate in like amounts. The conductivity of the target or cathode mainly arises from dopant (e.g., B and/or F), and/or oxygen vacancy. However, if the dopant concentration is too high, the excessive dopants in the film may act as defects and reduce conductivity. So, an optimized dopant concentration in the target is desired in certain example non-limiting situations.

Such ceramic zinc oxide/suboxide sputtering target(s) may be used to sputter-deposit ZnO layer 7 in a low oxygen environment (i.e., a low amount of oxygen gas is required in the sputtering chamber or bay where the target(s) is located) using either AC or DC sputtering. In certain embodiments, both oxygen and argon gas are introduced into the sputtering chamber housing the ceramic target via respective gas sources. In certain example embodiments of this invention, no more than about 40%, more preferably no more than about 30%, and most preferably no more than about 20% of the total gas (e.g., argon plus oxygen) in the sputtering chamber including the ceramic target is oxygen when the optional substoichiometric ceramic target(s) is used. In addition to the oxygen gas in the chamber, the remainder of the gas in the sputtering chamber may be an inert gas such as argon or the like. Due to the low percentage of $O_2$ gas, the degradation of silver properties in the IR reflecting layer(s) can be reduced due to less risk of crosstalk.

Infrared (IR) reflecting layer 9 is preferably substantially or entirely metallic and/or conductive, and may comprise or consist essentially of silver (Ag), gold, or any other suitable IR reflecting material. IR reflecting layer 9 helps allow the coating to have low-E and/or good solar control characteristics such as low emittance, low sheet resistance, and so forth. The IR reflecting layer may, however, be slightly oxidized in certain embodiments of this invention.

The lower and upper contact layers 8 and/or 11 may be of or include an oxide of Ni and/or Cr. In certain example embodiments, lower and/or upper contact layers 8, 11 may be of or include nickel (Ni) oxide, chromium/chrome (Cr) oxide, or a nickel alloy oxide such as nickel chrome oxide ($NiCrO_x$), or other suitable material(s). The use of, for example, $NiCrO_x$ in this layer(s) 11 allows durability to be improved. The $NiCrO_x$ layer(s) 8, 11 may be fully oxidized in certain embodiments of this invention (i.e., fully stoichiometric), or alternatively may only be partially oxidized-substoichiometric (before and/or after IT). In certain instances, the $NiCrO_x$ layer 8, 11 may be at least about 50% oxidized. Contact layer(s) 8, 11 (e.g., of or including an oxide of Ni and/or Cr) may or may not be oxidation graded in different embodiments of this invention. Oxidation grading means that the degree of oxidation in the layer changes through the thickness of the layer so that for example a contact layer may be graded so as to be less oxidized at the contact interface with the immediately adjacent IR reflecting layer 9 than at a portion of the contact layer(s) further or more/most distant from the immediately adjacent IR reflecting layer. Descriptions of various types of oxidation graded contact layers are set forth in U.S. Pat. No. 6,576,349, the disclosure of which is hereby incorporated herein by reference. Contact layer(s) 8, 11 (e.g., of or including an oxide of Ni and/or Cr) may or may not be continuous in different embodiments of this invention across the entire IR reflecting layer 9.

While zinc oxide is often used as a contact layer, it has surprisingly been found that the provision of layer 8 of or including an oxide of Ni and/or Cr between the zinc oxide of layer 7 and the silver of layer 9 results in a coating which realizes improved (i.e., lower) emissivity and/or sheet resistance after HT. Without layer 8 comprising an oxide of Ni and/or Cr between the zinc oxide and the silver, experiments have shown that the coating will have too high of a haze and/or sheet resistance value following HT. Thus, the use of the following sequence of immediately adjacent layers has been found to be surprisingly beneficial: (a) layer 5 comprising silicon nitride, (b) layer 7 comprising zinc oxide over and contacting the layer comprising silicon nitride, (c) layer 8 comprising an oxide of Ni and/or Cr over and contacting the layer comprising zinc oxide, and (d) an IR reflecting layer 9.

Dielectric layer 13 may be of or include a metal oxide such as tin oxide in certain example embodiments of this invention. Metal oxide inclusive layer 13 is provided for antireflection purposes, and also improves the emissivity of the coated article and the stability and efficiency of the manufacturing process. The tin oxide layer 13 may be doped with other materials such as nitrogen in certain example embodiments of this invention.

Dielectric layer 15, which may be an overcoat in certain example instances, may be of or include silicon nitride (e.g., $Si_3N_4$ or other suitable stoichiometry) or any other suitable material in certain example embodiments of this invention such as silicon oxynitride. Optionally, other layers may be provided above layer 15. Layer 15 is provided for durability purposes, and to protect the underlying layers. In certain example embodiments, layer 15 may have an index of refraction (n) of from about 1.9 to 2.2, more preferably from about 1.95 to 2.05.

Other layer(s) below or above the illustrated coating 25 may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention. For example and without limitation, layer 13 may be removed in certain example situations.

While various thicknesses may be used in different embodiments of this invention, example thicknesses and materials for the respective layers on the glass substrate 1 in the FIG. 1 embodiment are as follows, from the glass substrate outwardly (e.g., the Al content in the zinc oxide layer 7 may be from about 1-10%, more preferably from about 1-3% in certain example instances):

TABLE 1

(Example Materials/Thicknesses; FIG. 1 Embodiment)

| Layer | Preferred Range (Å) | More Preferred (Å) | Example (Å) |
|---|---|---|---|
| $TiO_x$ (layer 3) | 30-200 Å | 40-95 Å | 67 Å |
| $Si_xN_y$ (layer 5) | 20-300 Å | 60-160 Å | 111 Å |
| $ZnAlO_x$ (layer 7) | 10-200 Å | 40-120 Å | 72 Å |
| $NiCrO_x$ (layer 8) | 10-90 Å | 20-60 Å | 38 Å |
| Ag (layer 9) | 50-250 Å | 80-150 Å | 127 Å |
| $NiCrO_x$ (layer 11) | 10-80 Å | 20-70 Å | 48 Å |
| $SnO_2$ (layer 13) | 40-400 Å | 90-200 Å | 134 Å |
| $Si_xN_y$ (layer 15) | 50-750 Å | 150-400 Å | 304 Å |

In certain example embodiments of this invention, coated articles herein (e.g., see FIG. 1) may have the following low-E (low emissivity), solar and/or optical characteristics set forth in Table 2 when measured monolithically, following heat treatment (e.g., thermal tempering). The specific resistivity (SR) is of the silver IR reflecting layer 9.

TABLE 2

Low-E/Solar Characteristics (Monolithic; HT)

| Characteristic | General | More Preferred | Most Preferred |
|---|---|---|---|
| $R_s$ (ohms/sq.): | ≦5.0 | ≦3.8 | ≦3.4 |
| Ag SR (microohms.cm): | ≦5.0 | ≦4.5 | ≦4.2 |
| $E_n$: | ≦0.10 | ≦0.05 | ≦0.038 |
| $T_{vis}$ (%): | ≧70 | ≧80 | ≧85 |
| Haze: | ≦0.2 | ≦0.1 | ≦0.08 |

Moreover, coated articles including coatings according to certain example embodiments of this invention have the following optical characteristics (e.g., when the coating(s) is provided on a clear soda lime silica glass substrate 1 from 1 to 10 mm thick, preferably about 4 mm thick). In Table 3, all parameters are measured monolithically, before and/or after HT. It is noted that the ΔE* values in the table below are due to the HT (i.e., a function of a*, b*, and L* changes due to HT as known in the art).

TABLE 3

Example Optical Characteristics (Monolithic)

| Characteristic | General | More Preferred |
|---|---|---|
| $T_{vis}$ (or TY)(Ill. C, 2 deg.): | ≧70% | ≧80% (or ≧85%) |
| $a^*_t$ (Ill. C, 2°): | −2.5 to +1.0 | −2.0 to 0.0 |
| $b^*_t$ (Ill. C, 2°): | −1.0 to +6.0 | 0.0 to +4.0 |
| $L^*_t$: | ≧90 | ≧93 |
| $R_fY$ (Ill. C, 2 deg.): | 1 to 7% | 1 to 6% |
| $a^*_f$ (Ill. C, 2°): | −5.0 to +4.0 | −1.5 to +3.0 |
| $b^*_f$ (Ill. C, 2°): | −14.0 to +10.0 | −10.0 to 0 |
| $L^*_f$: | 22-30 | 25-30 |
| ΔE*: | | |
| $R_gY$ (Ill. C, 2 deg.): | 1 to 11% | 1 to 10% |
| $a^*_g$ (Ill. C, 2°): | −5.0 to +4.0 | −1.5 to +2.0 |
| $b^*_g$ (Ill. C, 2°): | −14.0 to +10.0 | −12.0 to 0 |
| $L^*_g$: | 27-40 | 30-37 |
| ΔE* (film side reflective): | ≦4.0 | ≦3.0 |
| ΔE* (transmissive): | ≦4.0 | ≦3.0 |

Moreover, coated articles including coatings according to certain example embodiments of this invention have the following optical characteristics when the coated article is an IG unit in certain example embodiments (e.g., for purposes of reference, when the coating is provided on a clear soda lime silica glass substrate 1 from 1 to 10 mm thick, preferably about 4 mm thick) on surface #3 of an IG window unit, following HT. It is noted that U-value is measured in accordance with EN 673.

TABLE 4

Example Optical Characteristics (IG Unit - HT)

| Characteristic | General | More Preferred |
|---|---|---|
| $T_{vis}$ (or TY)(Ill. C, 2 deg.): | ≧70% | ≧75% |
| $a^*_t$ (Ill. C, 2°): | −4.5 to +1.0 | −3.5 to 0.0 |
| $b^*_t$ (Ill. C, 2°): | −1.0 to +4.0 | 0.0 to 3.0 |
| $R_{outside}Y$ (Ill. C, 2 deg.): | ≦14% | ≦12% |
| $a^*_{out}$ (Ill. C, 2°): | −3.0 to +3.0 | −2 to +2.0 |
| $b^*_{out}$ (Ill. C, 2°): | −10.0 to +10.0 | −6.0 to 0 |
| $R_{inside}Y$ (Ill. C, 2 deg.): | ≦15% | ≦13% |
| $a^*_{inside}$ (Ill. C, 2°): | −5.0 to +4.0 | −1.5 to +3.0 |
| $b^*_{inside}$ (Ill. C, 2°): | −14.0 to +10.0 | −10.0 to 0 |
| U-value (IG)(W/($m^2$K)): | ≦1.25 | ≦1.15 (or ≦1.10) |

Figure 3:
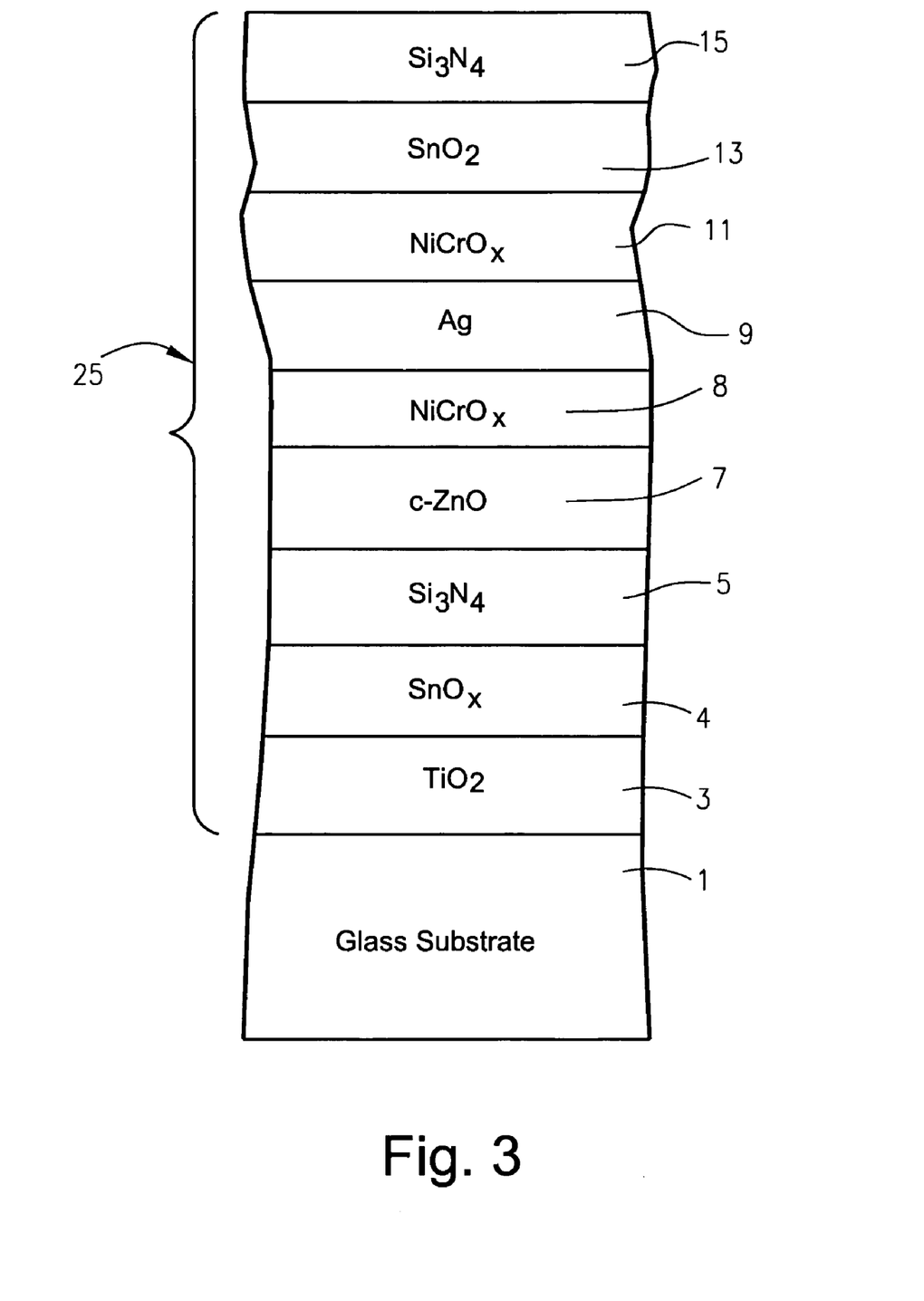
FIG. 3 is a cross sectional view of a coated article according to another example embodiment of this invention.

FIG. 3 is a cross sectional view of another example embodiment of this invention. The FIG. 3 embodiment is similar to that of FIG. 1 (and see tables above for characteristics), except that additional layer 4 of or including tin oxide is provided under the silicon nitride inclusive layer 5. The tin oxide layer 4 is located between and contacting the silicon nitride layer 5 and the titanium oxide layer 3 in certain example embodiments. The performance of this stack is similar to that of the FIG. 1 stack discussed above, in that it is fully temperable and displays good thermal stability, undergoing no significant degradation of performance during baking procedures.

In yet another example embodiment of this invention, the FIG. 1 embodiment may be modified by using tin oxide instead of silicon nitride for layer 5. While such a coating is somewhat similar with respect to stability, it does suffer with respect to an increase in normal emissivity after HT (e.g., around 0.05, instead of about 0.038 for an example of the FIG. 1 embodiment).

EXAMPLE

The following example is provided for purposes of example only, and is not intended to be limiting. The following Example was made via sputtering so as to have approximately the layer stack set forth below, from the clear glass substrate outwardly. The listed thicknesses are approximations:

TABLE 5

Layer Stack for Example

| Layer | Thickness |
|---|---|
| Glass Substrate | 4 mm |
| $TiO_x$ | 250 Å |
| $Si_3N_4$ | 10 Å |
| $ZnAlO_x$ | 80 Å |
| $NiCrO_x$ | 30 Å |
| Ag | 100 Å |
| $NiCrO_x$ | 30 Å |
| $SnO_2$ | 160 Å |
| $Si_3N_4$ | 300 Å |

The silver layer 9 was sputtered using two silver planar targets, and using gas flows including Ar and Kr, where much more Ar than Kr was used. The titanium oxide layer 3 was sputtered using two Ti inclusive targets in atmosphere including Ar and O gases. The silicon nitride layers 5 and 15 were sputtered using SiAl targets in atmosphere including Ar and N gases. The NiCrOx layers 8 and 11 were sputtered using NiCr targets in atmosphere including Ar and oxygen gases. The zinc oxide layer 7 was sputtered using a ceramic ZnO target in an atmosphere including Ar gas and a fairly small amount of oxygen gas. The tin oxide layer 13 was sputtered using three Sn targets in atmosphere including Ar, O and N gases. After being sputter deposited onto the glass substrate, the coated article of the Example had the following characteristics, measured monolithically (measured in the center of the coated article).

TABLE 6

Characteristics of Example (Monolithic - no HT)

| Characteristic | Example |
|---|---|
| Visible Trans. ($T_{vis}$ or TY)(Ill. C 2 deg.): | 81.7% |
| a* | −2.0 |
| b* | 2.8 |
| L* | 92.4 |
| Glass Side Reflectance (RY)(Ill C, 2 deg.): | 7.1% |
| a* | 0.2 |
| b* | −9.0 |
| L* | 31.9 |
| Film Side Reflective (FY)(Ill. C, 2 deg.): | 4.3 |
| a* | 4.5 |
| b* | −9.7 |
| L* | 24.7 |
| $R_s$ (ohms/square): | 4.6 |

Then, the coated article of the example was heat treated by thermally tempering it, via a twelve minute cycle with the four zones of the furnace at 580, 700, 700 and 640 degrees C., respectively. Following HT, the coated article had the following characteristics:

TABLE 7

Characteristics of Example (Monolithic - after HT)

| Characteristic | Example |
|---|---|
| Visible Trans. ($T_{vis}$ or TY)(Ill. C 2 deg.): | 86.8% |
| a* | −2.1 |
| b* | 2.4 |
| L* | 94.7 |
| Glass Side Reflectance (RY)(Ill C, 2 deg.): | 6.7% |
| a* | 3.2 |
| b* | −9.5 |
| L* | 31.1 |
| Film Side Reflective (FY)(Ill. C, 2 deg.): | 5.1% |
| a* | 4.7 |
| b* | −8.3 |
| L* | 26.9 |
| $R_s$ (ohms/square): | 3.3 |
| Emissivity (normal): | 0.038 |
| Haze: | 0.07 |
| ΔE* (film side reflective): | 2.62 |
| ΔE* (transmissive): | 2.34 |

Comparative examples were made and tested. For example, a comparative example that was similar to the Example above except that it did not include NiCrOx layer 8. This comparative example had a much higher emissivity following HT than did the Example above, thereby indicating the unexpected results associated with certain example embodiments of this invention. Another example was made and tested, and was similar to the Example above except that it used tin oxide instead of silicon nitride for layer 5. This example also had a higher emissivity following HT compared to the Example above.

The low film side reflective and transmissive ΔE* values, due to the heat treatment, is indicative of thermal stability upon heat treatment.

When the aforesaid monolithic Example was used in an IG window unit, the IG window unit had a U-value of about 1.1 W/(m²K).

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A heat treated coated article including a coating supported by a glass substrate, the coating comprising:
   a dielectric layer;
   a layer comprising silicon nitride;
   a layer comprising zinc oxide over and directly contacting the layer comprising silicon nitride;
   a layer comprising an oxide of Ni and/or Cr over and directly contacting the layer comprising zinc oxide;
   an infrared (IR) reflecting layer comprising silver on the glass substrate, located over and directly contacting the layer comprising an oxide of Ni and/or Cr;
   another layer comprising an oxide of Ni and/or Cr located over and directly contacting the IR reflecting layer comprising silver;
   a layer comprising a metal oxide located over and directly contacting the another layer comprising the oxide of Ni and/or Cr;
   a layer comprising silicon nitride located over the layer comprising the metal oxide; and
   wherein the layer comprising zinc oxide is formed using a ceramic target comprising zinc oxide so that the IR reflecting layer comprising silver has a specific resistivity (SR) of no greater than 4.2 microohms·cm and the coating has a sheet resistance of no greater than 3.8 ohms/square.

2. The coated article of claim 1, wherein the coated article includes only one layer comprising silver.

3. The coated article of claim 1, wherein the dielectric layer comprises titanium oxide.

4. The coated article of claim 1, wherein the dielectric layer comprises tin oxide.

5. The coated article of claim 1, further comprising a layer comprising tin oxide provided between the dielectric layer and the layer comprising silicon nitride.

6. The coated article of claim 1, wherein the coating has a sheet resistance ($R_s$) of no greater than 3.4 ohms/square.

7. The coated article of claim 1, wherein the coated article is an insulating glass (IG) window unit.

8. The coated article of claim 1, wherein the coated article is an insulating glass (IG) window unit, the IG window unit comprising said glass substrate and another glass substrate spaced therefrom, and wherein the IG window unit has a U-value of no greater than 1.25 W/(m²K).

9. The coated article of claim 8, wherein the IG window unit has a U-value of no greater than 1.15 W/(m²K).

10. The coated article of claim 9, wherein the IG window unit has a U-value of no greater than 1.1 W/(m²K).

11. The coated article of claim 9, wherein the IG window unit has a visible transmission of at least 70%.

12. The coated article of claim 1, wherein the coated article has a ΔE* value (transmissive and/or film side reflective) of no greater than 4.0 due to heat treatment.

13. The coated article of claim 1, wherein the coated article has a ΔE* value (transmissive and/or film side reflective) of no greater than 3.0 due to heat treatment.

14. The coated article of claim 1, wherein the layer comprising zinc oxide is doped with from about 0.5 to 3% P and/or B.

15. The coated article of claim 1, wherein the layer comprising zinc oxide is doped with from about 0.5 to 3% F and/or B.

16. A coated article including a coating supported by a glass substrate, the coating comprising, from the glass substrate outwardly:

a layer comprising silicon nitride or tin oxide;

a layer comprising zinc oxide over and directly contacting the layer comprising silicon nitride or tin oxide;

a layer comprising an oxide of Ni and/or Cr over and directly contacting the layer comprising zinc oxide;

an infrared (IR) reflecting layer comprising silver over and directly contacting the layer comprising an oxide of Ni and/or Cr;

a dielectric layer; and wherein the IR reflecting layer comprising silver has a specific resistivity (SR) of no greater than 4.5 microohms.cm and the coating has a sheet resistance of no greater than 3.8 ohms/square, and wherein the layer comprising zinc oxide is doped with F and/or B.

17. The coated article of claim 16, further comprising a layer comprising a metal oxide located between the glass substrate and the layer comprising silicon nitride or tin oxide.

18. The coated article of claim 16, wherein the coated article is not heat treated and the layer comprising the oxide of Ni and/or Cr is substoichiometric.

19. The coated article of claim 16, wherein the coated article is heat treated.

20. The coated article of claim 15, further comprising:

another layer comprising an oxide of Ni and/or Cr located over and directly contacting the IR reflecting layer comprising silver;

a layer comprising a metal oxide located over and directly contacting the another layer comprising the oxide of Ni and/or Cr; and a dielectric layer located over the layer comprising the metal oxide.

21. The coated article of claim 16, wherein the coated article has only one IR reflecting layer comprising silver, is thermally tempered, and has a sheet resistance of no greater than 3.4 ohms/square.

22. The coated article of claim 16, wherein the layer comprising zinc oxide is doped with from about 0.5 to 3% F and/or B.

* * * * *